United States Patent
Goktepeli et al.

(10) Patent No.: US 9,812,580 B1
(45) Date of Patent: Nov. 7, 2017

(54) DEEP TRENCH ACTIVE DEVICE WITH BACKSIDE BODY CONTACT

(71) Applicant: QUALCOMM Incorporated, San Diego, CA (US)

(72) Inventors: Sinan Goktepeli, San Diego, CA (US); Steve Fanelli, San Marcos, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/257,823

(22) Filed: Sep. 6, 2016

(51) Int. Cl.
| | |
|---|---|
| H01L 27/108 | (2006.01) |
| H01L 29/786 | (2006.01) |
| H01L 29/06 | (2006.01) |
| H01L 23/522 | (2006.01) |
| H01L 23/66 | (2006.01) |
| H01L 21/762 | (2006.01) |
| H01Q 1/38 | (2006.01) |
| H01Q 1/24 | (2006.01) |

(52) U.S. Cl.
CPC .. *H01L 29/78615* (2013.01); *H01L 21/76251* (2013.01); *H01L 23/5223* (2013.01); *H01L 23/66* (2013.01); *H01L 29/0649* (2013.01); *H01Q 1/241* (2013.01); *H01Q 1/38* (2013.01); *H01L 2223/6616* (2013.01); *H01L 2223/6677* (2013.01)

(58) Field of Classification Search
CPC ........... H01L 29/78615; H01L 29/0649; H01L 21/76251; H01L 23/5223; H01L 23/66; H01Q 1/241; H01Q 1/38
See application file for complete search history.

(56) References Cited

U.S. PATENT DOCUMENTS

| | | | |
|---|---|---|---|
| 5,889,298 A | 3/1999 | Plumton et al. | |
| 6,838,722 B2 | 1/2005 | Bhalla et al. | |
| 7,419,878 B2 | 9/2008 | Williams et al. | |
| 8,395,880 B2 * | 3/2013 | Wasson | H01G 4/005 361/301.1 |
| 9,159,825 B2 | 10/2015 | Molin et al. | |
| 9,331,098 B2 | 5/2016 | Stuber et al. | |

* cited by examiner

Primary Examiner — Matthew Gordon

(57) ABSTRACT

An integrated circuit may include a gate, having gate fingers. The integrated circuit may also include a body, having semiconductor pillars interlocking with the gate fingers of the gate. The integrated circuit may also include a backside contact(s) coupled to the body. The integrated circuit may further include a backside metallization. The backside metallization may be coupled to the body through the backside contact(s).

25 Claims, 13 Drawing Sheets

DEEP TRENCH ACTIVE DEVICE WITH BACKSIDE BODY CONTACT

TECHNICAL FIELD

The present disclosure generally relates to integrated circuits (ICs). More specifically, the present disclosure relates to a deep trench active device with a backside body contact.

BACKGROUND

Mobile radio frequency (RF) chip designs (e.g., mobile RF transceivers), including high performance diplexers have migrated to a deep sub-micron process node due to cost and power consumption considerations. The design of such mobile RF transceivers becomes complex at this deep submicron process node. The design complexity of these mobile RF transceivers is further complicated by added circuit functions to support communication enhancements, such as carrier aggregation. Further design challenges for mobile RF transceivers include analog/RF performance considerations, such as mismatch, noise and other performance considerations. The design of these mobile RF transceivers includes the use of additional passive devices, for example, to suppress resonance, and/or to perform filtering, bypassing and coupling.

The design of these mobile RF transceivers may include the use of silicon on insulator (SOI) technology. SOI technology replaces conventional silicon substrates with a layered silicon-insulator-silicon substrate to reduce parasitic device capacitance and improve performance. SOI-based devices differ from conventional, silicon-built devices because the silicon junction is above an electrical isolator, typically a buried oxide (BOX) layer. A reduced thickness BOX layer, however, may not sufficiently reduce the parasitic capacitance caused by the proximity of an active device on the silicon layer and a substrate supporting the BOX layer.

Unfortunately, a transistor fabricated using SOI technology generally suffers from the floating body effect, in which the transistor's body forms a capacitor against the insulated substrate. In this arrangement, charge that accumulates on the capacitor causes adverse effects, such as parasitic transistors in the structure and off-state leakage, as well as dependence of the threshold voltage of the transistor on its previous states. The floating body effect is especially acute in analog devices, in which threshold voltage control and body charging control are prevented by the floating body effect. A body contact may be used to prevent the floating body effect. Unfortunately, use of a body contact results in an area penalty.

SUMMARY

An integrated circuit may include a gate, having gate fingers. The integrated circuit may also include a body, having semiconductor pillars interlocking with the gate fingers of the gate. The integrated circuit may also include a backside contact(s) coupled to the body. The integrated circuit may further include a backside metallization. The backside metallization may be coupled to the body through the backside contact(s).

A method of constructing an integrated circuit may include etching a semiconductor layer within an isolation layer to form a body, including semiconductor pillars. The method may also include depositing a dielectric material layer on a front-side surface of the isolation layer and on a surface of the semiconductor pillars. The method may further include depositing a semiconductor material on the dielectric material layer and in trenches separating the semiconductor pillars to form a gate including gate fingers interlocking with the semiconductor pillars. The method may also include bonding a handle substrate to a front-side dielectric layer on the front-side surface of the isolation layer. The method may further include fabricating a backside metallization in a backside dielectric layer supporting a backside surface of the isolation layer. The backside metallization may be coupled to the body through a backside contact(s).

An integrated circuit may include a gate, having gate fingers. The integrated circuit may also include a body, having semiconductor pillars interlocking with the gate fingers of the gate. The integrated circuit may also include a backside contact(s) coupled to the body. The integrated circuit may further include a means for tying the body through the backside contact(s).

A radio frequency (RF) front end module may include an integrated RF circuit. The integrated RF circuit may include a deep trench switch transistor, having a gate including gate fingers. The integrated RF circuit may also include a body having semiconductor pillars interlocking with the gate fingers. The integrated RF circuit may further include a backside contact(s) coupled to the body, and a backside metallization coupled to the body through the backside contact(s). The RF front end module may also include an antenna coupled to an output of the switch transistor.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

Figure 1A:
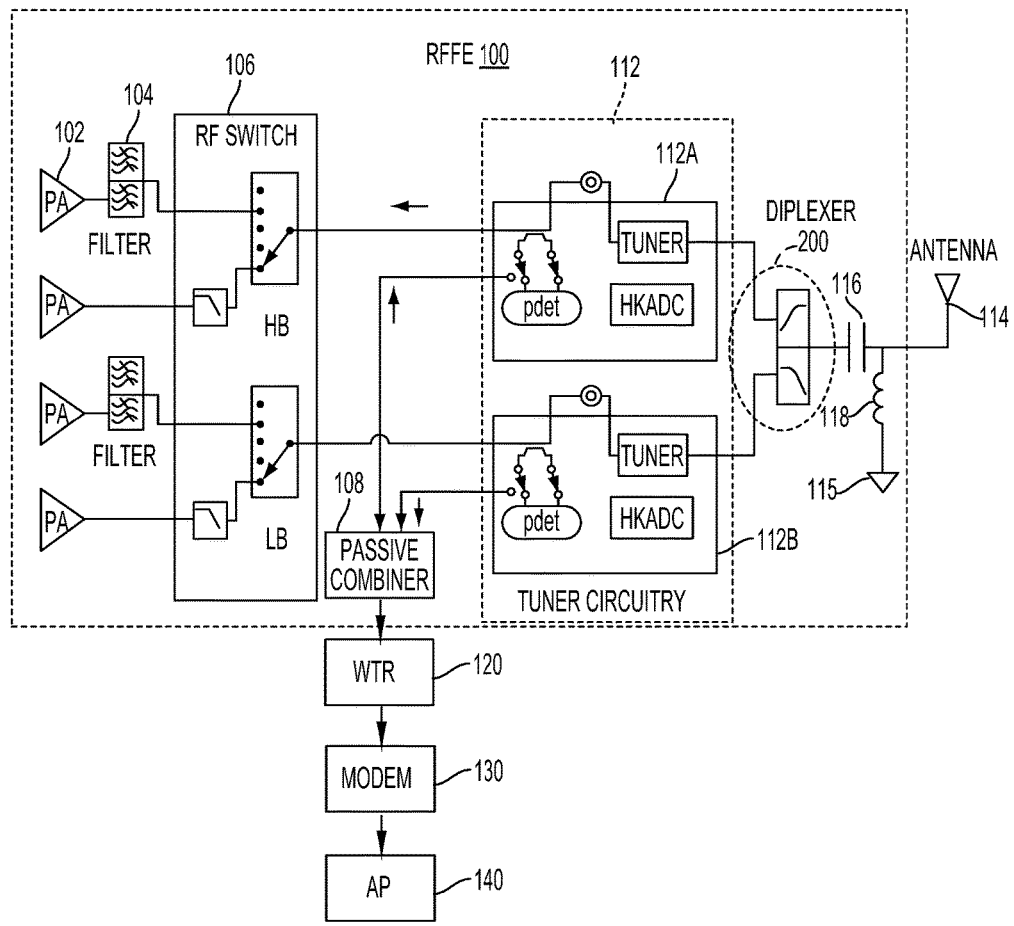
FIG. 1A is a schematic diagram of a radio frequency (RF) front end (RFFE) module employing a diplexer according to an aspect of the present disclosure.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. It will be apparent to those skilled in the art, however, that these concepts may be practiced without these specific details. In some instances, well-known structures and components are shown in block diagram form in order to avoid obscuring such concepts. As described herein, the use of the term "and/or" is intended to represent an "inclusive OR", and the use of the term "or" is intended to represent an "exclusive OR".

Mobile radio frequency (RF) chip designs (e.g., mobile RF transceivers) have migrated to a deep sub-micron process node due to cost and power consumption considerations. The design complexity of mobile RF transceivers is further complicated by added circuit functions to support communication enhancements, such as carrier aggregation.

The design of these mobile RF transceivers may include the use of silicon on insulator (SOI) technology. SOI technology replaces conventional silicon substrates with layered silicon-insulator-silicon substrates to reduce parasitic device capacitance and improve performance. SOI-based devices differ from conventional, silicon-built devices because the silicon junction is above an electrical isolator, typically a buried oxide (BOX) layer, in which a thickness of the BOX layer may be reduced. A reduced thickness BOX layer, however, may not sufficiently reduce the parasitic capacitance caused by the proximity of an active device on the silicon layer and a substrate supporting the BOX layer.

A transistor fabricated using SOI technology generally suffers from the floating body effect, in which the transistor's body forms a capacitor against the insulated substrate. In this arrangement, charge that accumulates on the capacitor causes adverse effects, such as parasitic transistors in the structure and off-state leakage, as well as dependence of the threshold voltage of the transistor on its previous states. The floating body effect is especially acute in analog devices, in which threshold voltage control and body charging control are prevented by the floating body effect. A body contact may be used to prevent the floating body effect. Unfortunately, use of a body contact results in an area penalty. As a result, aspects of the present disclosure include a post-layer transfer process to enable formation of a backside body tie for a deep trench active device.

The process flow for semiconductor fabrication of the integrated circuit structure may include front-end-of-line (FEOL) processes, middle-of-line (MOL) (also referred to as middle-end-of-line (MEOL)) processes, and back-end-of-line (BEOL) processes. The FEOL processes include ion implantation, anneals, oxidation, chemical vapor deposition (CVD) or atomic layer deposition (ALD), etching, chemical mechanical polishing (CMP), epitaxy. The MOL processes may include the set of process steps that enable connection of the transistors to BEOL interconnects. These steps include silicidation and contact formation as well as stress introduction. The BEOL processes may include the set of process steps that form the interconnect that ties the independent transistors and form circuits.

Aspects of the present disclosure describe a deep trench switch transistor with a backside body contact that may be used as antenna switch transistor in integrated radio frequency (RF) circuit structures for high quality (Q)-factor RF applications. In one configuration, a pre-layer transfer process forms the deep trench transistor. In addition, a post-layer transfer process forms a backside body contact to tie the body of the deep trench switch transistor. The post-layer transfer process of forming the backside body tie solves the floating body effect problem associated with SOI devices by preventing the body of the deep switch transistor from floating, while avoiding an area penalty or unwanted resistance paths associated with conventional body contacts.

FIG. 1A is a schematic diagram of a radio frequency (RF) front end (RFFE) module 100 employing a diplexer 200 according to an aspect of the present disclosure. The RF front end module 100 includes power amplifiers 102, duplexer/filters 104, and a radio frequency (RF) switch module 106. The power amplifiers 102 amplify signal(s) to a certain power level for transmission. The duplexer/filters 104 filter the input/output signals according to a variety of different parameters, including frequency, insertion loss, rejection or other like parameters. In addition, the RF switch module 106 may select certain portions of the input signals to pass on to the rest of the RF front end module 100.

The RF front end module 100 also includes tuner circuitry 112 (e.g., first tuner circuitry 112A and second tuner circuitry 112B), the diplexer 200, a capacitor 116, an inductor 118, a ground terminal 115 and an antenna 114. The tuner circuitry 112 (e.g., the first tuner circuitry 112A and the second tuner circuitry 112B) includes components such as a tuner, a portable data entry terminal (PDET), and a house keeping analog to digital converter (HKADC). The tuner circuitry 112 may perform impedance tuning (e.g., a voltage standing wave ratio (VSWR) optimization) for the antenna 114. The RF front end module 100 also includes a passive combiner 108 coupled to a wireless transceiver (WTR) 120. The passive combiner 108 combines the detected power from the first tuner circuitry 112A and the second tuner circuitry 112B. The wireless transceiver 120 processes the information from the passive combiner 108 and provides this information to a modem 130 (e.g., a mobile station modem (MSM)). The modem 130 provides a digital signal to an application processor (AP) 140.

As shown in FIG. 1A, the diplexer 200 is between the tuner component of the tuner circuitry 112 and the capacitor 116, the inductor 118, and the antenna 114. The diplexer 200 may be placed between the antenna 114 and the tuner circuitry 112 to provide high system performance from the RF front end module 100 to a chipset including the wireless transceiver 120, the modem 130 and the application processor 140. The diplexer 200 also performs frequency domain multiplexing on both high band frequencies and low band frequencies. After the diplexer 200 performs its frequency multiplexing functions on the input signals, the output of the diplexer 200 is fed to an optional LC (inductor/capacitor) network including the capacitor 116 and the inductor 118. The LC network may provide extra impedance matching components for the antenna 114, when desired. Then a signal with the particular frequency is transmitted or received by the antenna 114. Although a single capacitor and inductor are shown, multiple components are also contemplated.

Figure 1B:
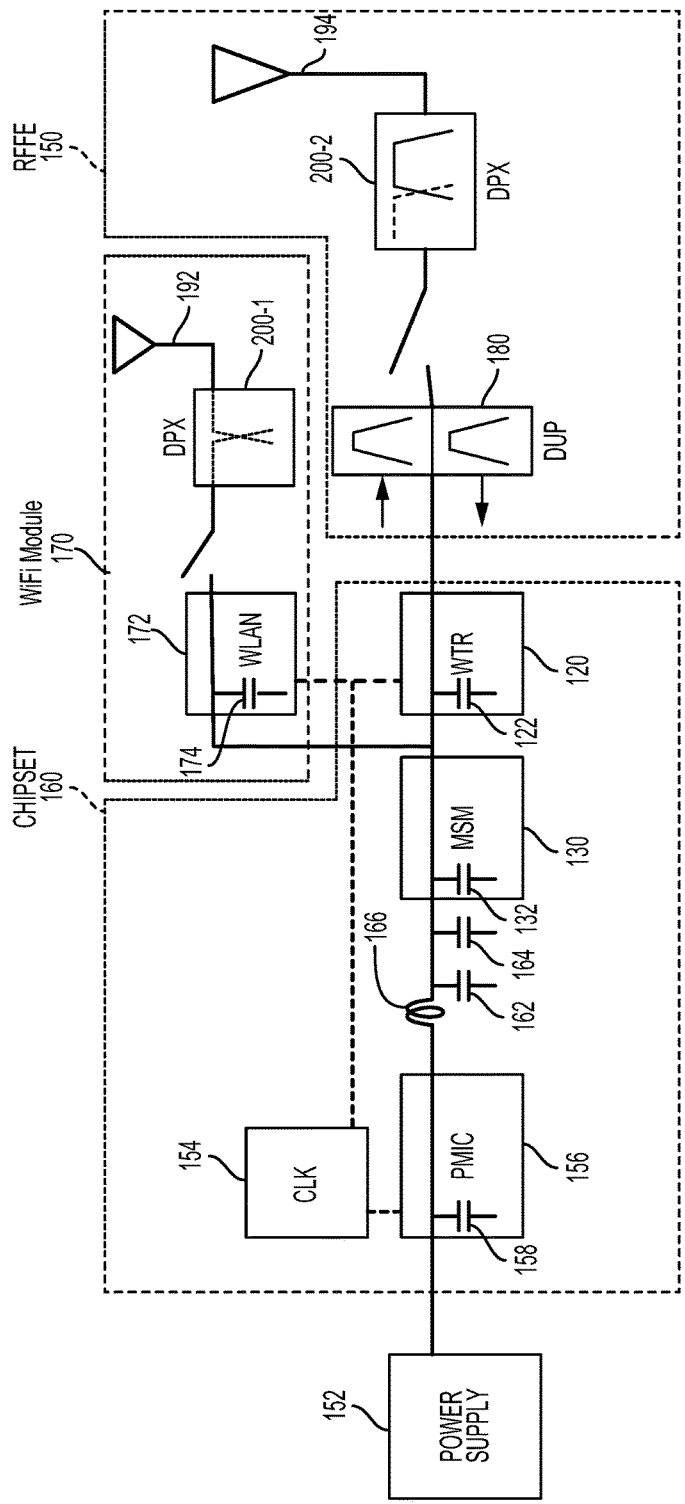
FIG. 1B is a schematic diagram of a radio frequency (RF) front end (RFFE) module employing diplexers for a chipset to provide carrier aggregation according to aspects of the present disclosure.

FIG. 1B is a schematic diagram of a wireless local area network (WLAN) (e.g., WiFi) module 170 including a first diplexer 200-1 and an RF front end module 150 including a second diplexer 200-2 for a chipset 160 to provide carrier aggregation according to an aspect of the present disclosure. The WiFi module 170 includes the first diplexer 200-1 communicably coupling an antenna 192 to a wireless local area network module (e.g., WLAN module 172). The RF front end module 150 includes the second diplexer 200-2 communicably coupling an antenna 194 to the wireless transceiver (WTR) 120 through a duplexer 180. The wireless transceiver 120 and the WLAN module 172 of the WiFi module 170 are coupled to a modem (MSM, e.g., baseband modem) 130 that is powered by a power supply 152 through a power management integrated circuit (PMIC) 156. The chipset 160 also includes capacitors 162 and 164, as well as an inductor(s) 166 to provide signal integrity. The PMIC 156, the modem 130, the wireless transceiver 120, and the WLAN module 172 each include capacitors (e.g., 158, 132, 122, and 174) and operate according to a clock 154. The geometry and arrangement of the various inductor and capacitor components in the chipset 160 may reduce the electromagnetic coupling between the components.

Figure 2A:
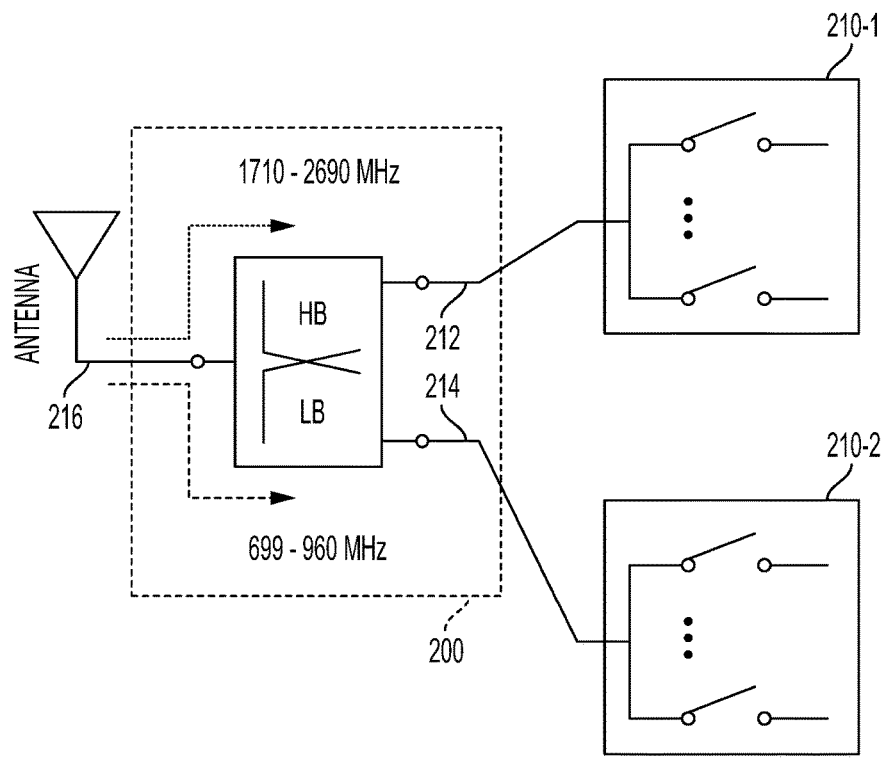
FIG. 2A is a diagram of a diplexer design according to an aspect of the present disclosure.

FIG. 2A is a diagram of a diplexer 200 according to an aspect of the present disclosure. The diplexer 200 includes a high band (HB) input port 212, a low band (LB) input port 214, and an antenna 216. A high band path of the diplexer 200 includes a high band antenna switch 210-1. A low band path of the diplexer 200 includes a low band antenna switch 210-2. A wireless device including an RF front end module may use the antenna switches 210 and the diplexer 200 to enable a wide range band for an RF input and an RF output of the wireless device. In addition, the antenna 216 may be a multiple input, multiple output (MIMO) antenna. Multiple input, multiple output antennas will be widely used for the RF front end of wireless devices to support features such as carrier aggregation.

Figure 2B:
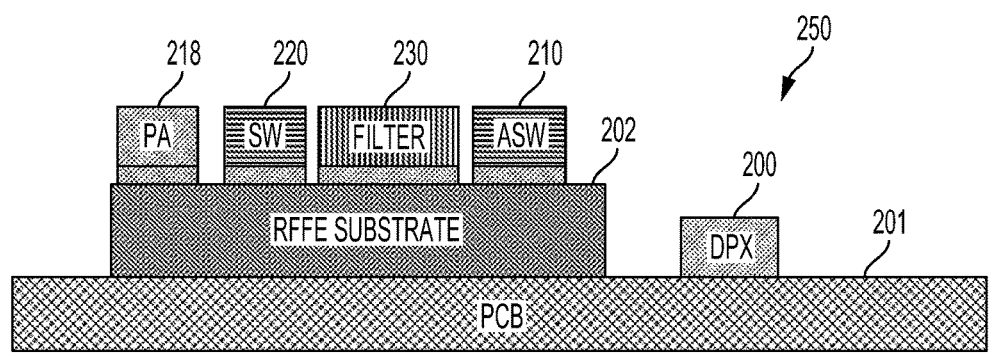
FIG. 2B is a diagram of a radio frequency (RF) front end module according to an aspect of the present disclosure.

FIG. 2B is a diagram of an RF front end module 250 according to an aspect of the present disclosure. The RF front end module 250 includes the antenna switch (ASW) 210 and diplexer 200 (or triplexer) to enable the wide range band noted in FIG. 2A. In addition, the RF front end module 250 includes filters 230, an RF switch 220 and power amplifiers 218 supported by a substrate 202. The filters 230 may include various LC filters, having inductors (L) and capacitors (C) arranged along the substrate 202 for forming a diplexer, a triplexer, low pass filters, balun filters, and/or notch filters to prevent high order harmonics in the RF front end module 250. The diplexer 200 may be implemented as a surface mount device (SMD) on a system board 201 (e.g., printed circuit board (PCB) or package substrate). Alternatively, the diplexer 200 may be implemented on the substrate 202.

In this configuration, the RF front end module 250 is implemented using silicon on insulator (SOI) technology, which helps reduce high order harmonics in the RF front end module 250. SOI technology replaces conventional silicon substrates with a layered silicon-insulator-silicon substrate to reduce parasitic device capacitance and improve performance. SOI-based devices differ from conventional silicon-built devices because the silicon junction is above an electrical insulator, typically a buried oxide (BOX) layer. A reduced thickness BOX layer, however, may not sufficiently reduce the parasitic capacitance caused by the proximity between an active device (on the silicon layer) and a substrate supporting the BOX layer. As a result, aspects of the present disclosure include a layer transfer process to further separate the active device from the substrate, as shown in FIGS. 3A to 3E.

Figure 3A:
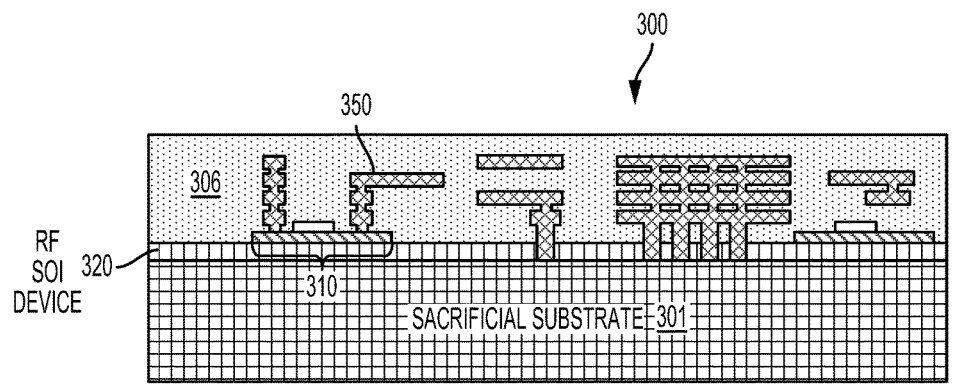
FIGS. 3A to 3E show cross-sectional views of an integrated radio frequency (RF) circuit structure during a layer transfer process according to aspects of the present disclosure.
Figure 3B:
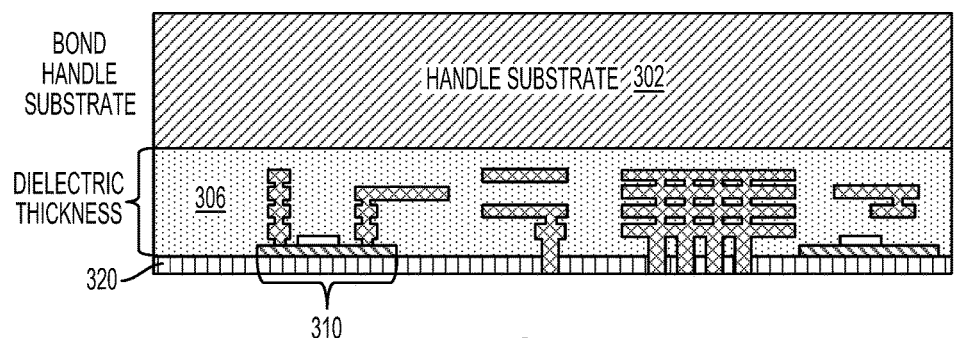

FIGS. 3A to 3E show cross-sectional views of an integrated radio frequency (RF) circuit structure 300 during a layer transfer process according to aspects of the present disclosure. As shown in FIG. 3A, an RF silicon on insulator (SOI) device includes an active device 310 on a buried oxide (BOX) layer 320 supported by a sacrificial substrate 301 (e.g., a bulk wafer). The RF SOI device also includes interconnects 350 coupled to the active device 310 within a first dielectric layer 306. As shown in FIG. 3B, a handle substrate 302 is bonded to the first dielectric layer 306.

As shown in FIG. 3B, a handle substrate 302 is bonded to the front-side dielectric layer 306 of the RF SOI device. In addition, the sacrificial substrate 301 is removed. Removal of the sacrificial substrate 301 using the layer transfer process enables high-performance, low-parasitic RF devices by increasing the dielectric thickness. That is, a parasitic capacitance of the RF SOI device is proportional to the dielectric thickness, which determines the distance between the active device 310 and the handle substrate 302.

Figure 3C:
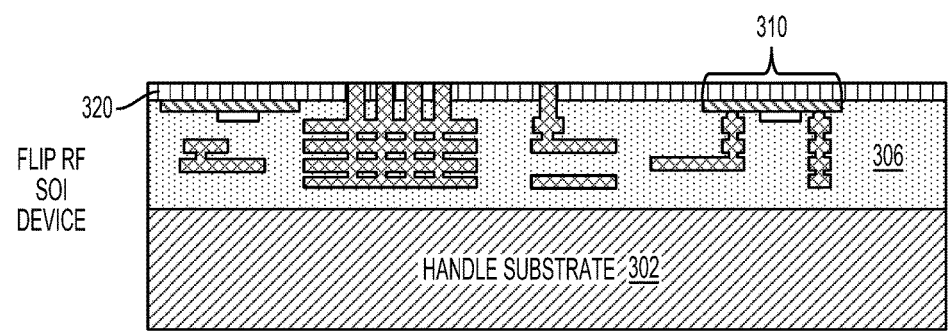
Figure 3D:
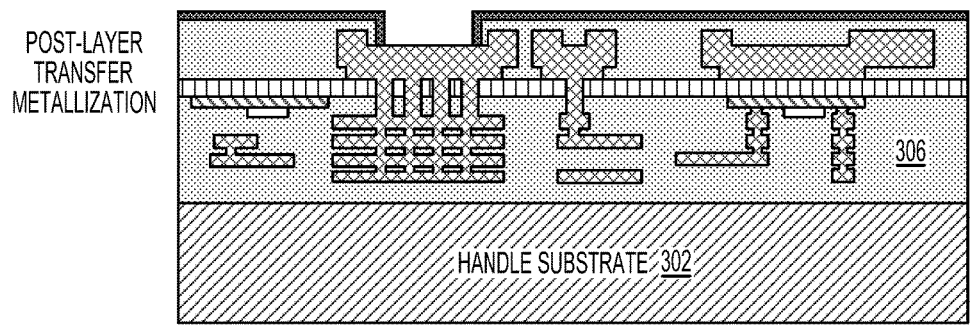
Figure 3E:
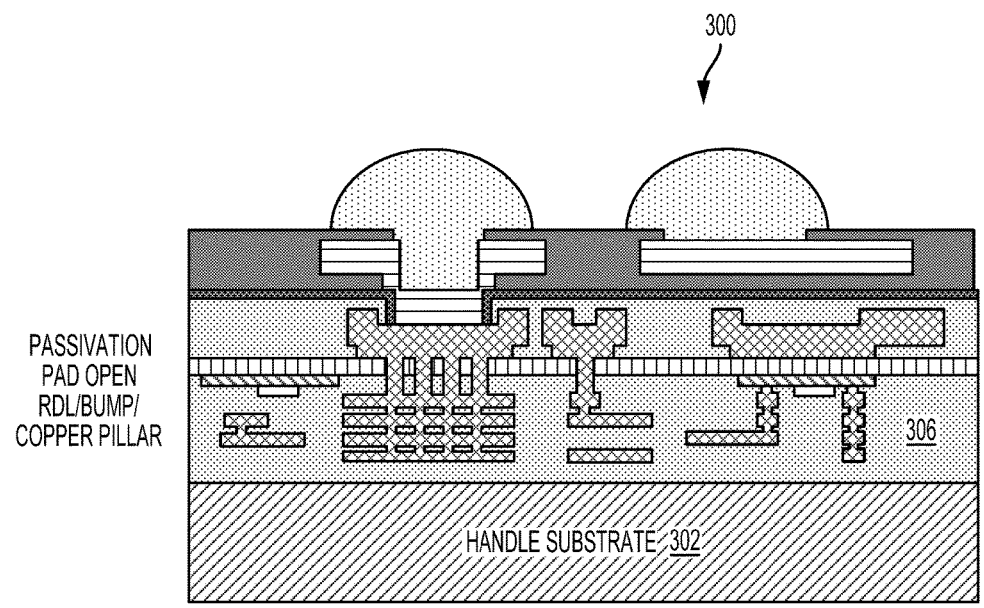

As shown in FIG. 3C, the RF SOI device is flipped once the handle substrate 302 is secured and the sacrificial substrate 301 is removed. As shown in FIG. 3D, a post-layer transfer metallization process is performed using, for example, a regular complementary metal oxide semiconductor (CMOS) process. As shown in FIG. 3E, an integrated RF circuit structure 300 is completed by depositing a passivation layer, opening bond pads, depositing a redistribution layer, and forming conductive bumps/pillars to enable bonding of the integrated RF circuit structure 300 to a system board (e.g., a printed circuit board (PCB)).

Referring again to FIG. 3A, the RF SOI device may include a trap rich layer between the sacrificial substrate 301 and the BOX layer 320. In addition, the sacrificial substrate 301 may be replaced with the handle substrate 302, and a thickness of the BOX layer 320 may be increased to improve harmonics. Although this arrangement of the RF SOI device may provide improved harmonics relative to a pure silicon or SOI implementation, the RF SOI device is limited by the non-linear responses from the handle substrate, especially when a silicon handle substrate is used. That is, in FIG. 3A, the increased thickness of the BOX layer 320 does not provide sufficient distance between the active device 310 and the sacrificial substrate 301 relative to the configurations shown in FIGS. 3B to 3E. Moreover, the RF SOI device is generally limited to CMOS transistor formation on one side of the SOI layer.

Figure 4:
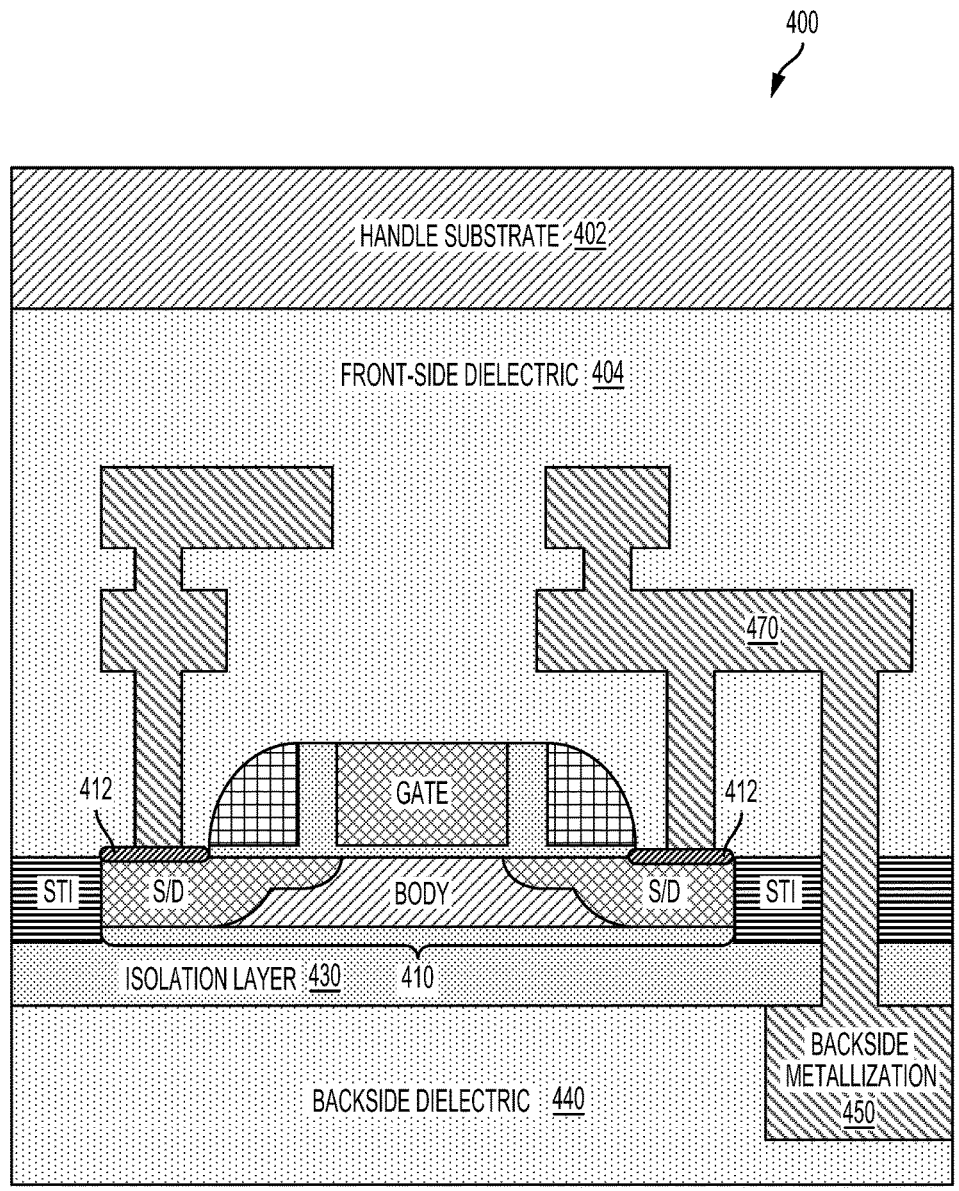
FIG. 4 is a cross-sectional view of an integrated radio frequency (RF) circuit structure fabricated using a layer transfer process according to aspects of the present disclosure.

FIG. 4 is a cross-sectional view of an integrated RF circuit structure 400 fabricated using a layer transfer process according to aspects of the present disclosure. Representatively, the integrated RF circuit structure 400 includes an active device 410 having a gate, a body, and source/drain regions formed on an isolation layer 430. In silicon on insulator (SOI) implementations, the isolation layer 430 is a buried oxide (BOX) layer, and the body and source/drain regions are formed from an SOI layer including shallow trench isolation (STI) regions supported by the BOX layer.

The integrated RF circuit structure 400 also includes middle-end-of-line (MEOL)/back-end-of-line (BEOL) interconnects coupled to the source/drain regions of the active device 410. As described, the MEOL/BEOL layers are referred to as front-side layers. By contrast, the layers supporting the isolation layer 430 may be referred to as backside layers. According to this nomenclature, a front-side interconnect 470 is coupled to the source/drain regions of the active device 410 through front-side contacts 412 in a front-side dielectric layer 404. In addition, a handle substrate 402 is coupled to the front-side dielectric layer 404. In this configuration, a backside dielectric 440 is adjacent to and possibly supports the isolation layer 430. In addition, a backside metallization 450 is coupled to the front-side interconnect 470.

As shown in FIG. 4, a layer transfer process increases separation between the active device 410 and the handle substrate 402 to improve the harmonics of the integrated RF circuit structure 400. While the layer transfer process enables high-performance, low-parasitic RF devices, the integrated RF circuit structure 400 may suffer from the floating body effect. That is, active devices fabricated using SOI technology generally suffer from the floating body effect, in which the transistor's body forms a capacitor against the insulated substrate. The floating body effect is especially acute in analog devices, in which threshold voltage control and body charging control are prevented by the floating body effect. A body contact may be used to prevent the floating body effect. Unfortunately, use of a body contact results in a significant area penalty. As a result, aspects of the present disclosure include a post-layer transfer process to enable formation of a backside body tie for a deep trench active device.

Various aspects of the disclosure provide techniques for a post-layer transfer process to enable formation of a backside body tie for an integrated circuit structure. By contrast, access to active devices, formed during a front-end-of-line (FEOL) process, is conventionally provided during middle-end-of-line (MEOL) processing that provides contacts between the gates and source/drain regions of the active devices and back-end-of-line (BEOL) interconnect layers (e.g., M1, M2, etc.). Aspects of the present disclosure involve a post-layer transfer process for forming deep trench switch transistors having backside body ties that may be used as antenna switch transistors in integrated radio frequency (RF) circuit structures for high quality (Q)-factor RF applications. Other applications include an active device in a low power amplifier module, a low noise amplifier, and an antenna diversity switch.

Figure 5:
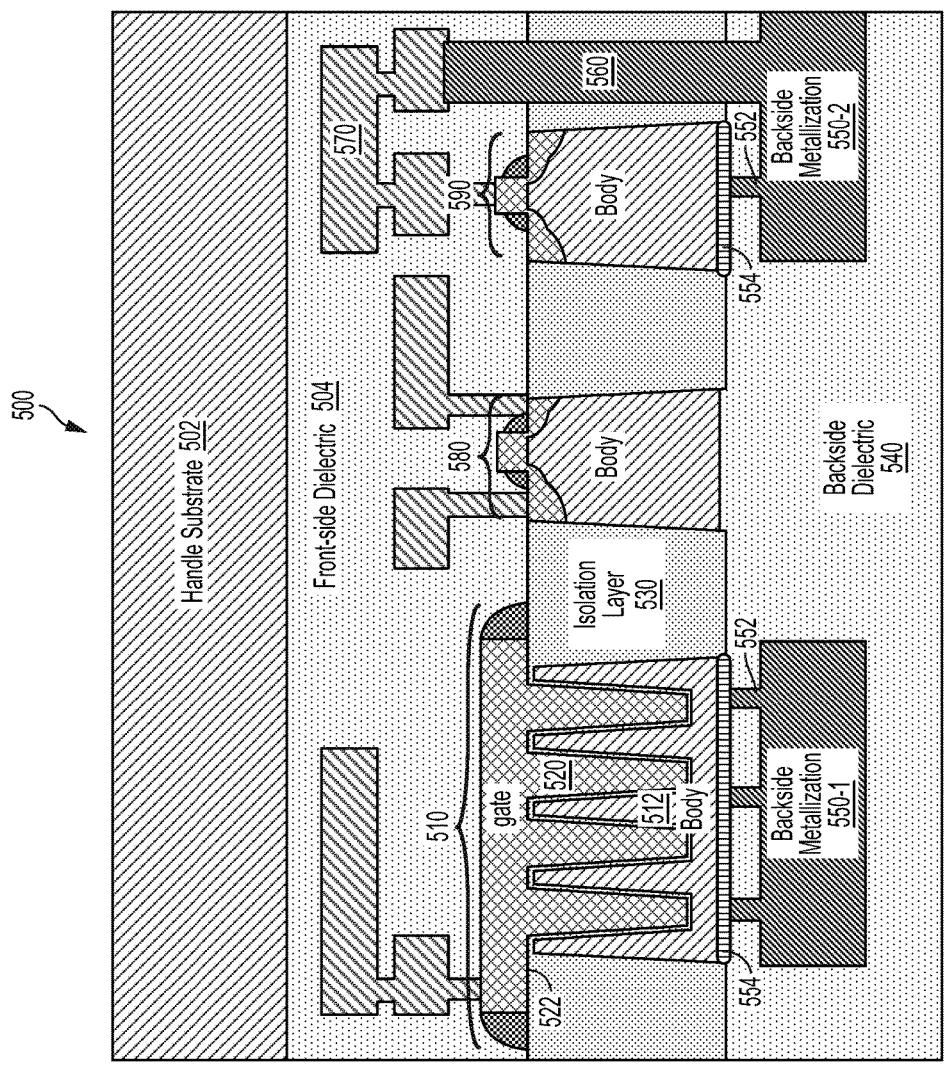
FIG. 5 is a cross-sectional view of an integrated circuit structure, including a deep trench active device having a backside body contact, according to an aspect of the present disclosure.

FIG. 5 is a cross-sectional view of an integrated circuit structure 500, including a deep trench active device (e.g., a switch transistor) having a backside body tie, according to aspects of the present disclosure. In aspects of the present disclosure, a post-layer transfer process enables the formation of a backside body tie, which solves the floating body effect associated with conventional silicon on insulator fabrication processes. Representatively, the integrated circuit structure 500 includes a deep trench active device 510 on a front-side surface of an isolation layer 530 and extending through to a backside surface of the isolation layer 530. In this configuration, a body of the deep trench active device 510 is composed of semiconductor pillars 512 that are formed from a semiconductor layer (e.g., silicon for an SOI implementation). The pillars need not be closely spaced, as long as more length is obtained in a smaller area (e.g., "accordion" effect). In addition, the gate is composed of gate fingers 520 interlocking with semiconductor pillars 512 and separated by a dielectric material layer 522 (e.g., a gate dielectric) and extending through the isolation layer 530.

The isolation layer 530 may be a buried oxide (BOX) layer for a silicon on insulator (SOI) implementation, in which the body and source/drain regions (not shown) are formed from an SOI layer. Alternatively, the isolation layer 530 may be a deep trench isolation region to isolate the deep trench active device 510 from a first trench-type active device 580 and a second trench-type active device 590. Additional details regarding the first trench-type active device 580 and the second trench-type active device 590 are omitted to avoid obscuring details of the present disclosure. In addition, trench-type switch transistors may be configured as negative metal oxide semiconductor (NMOS) switch transistors or positive MOS (PMOS transistors) depending on the implant process for doping the n-type (e.g., a first doped region) and p-type (e.g., a second doped region) semiconductor regions to provide a drain region and a source region of a deep trench switch transistor.

In this aspect of the present disclosure, the integrated circuit structure 500 also includes a backside metallization 550 arranged in a backside dielectric layer 540 supporting the backside surface opposite the front-side surface of the isolation layer 530. The backside metallization 550, according to aspects of the present disclosure, provides a low resistance body tie for the deep trench active device 510. In this arrangement, a first portion 550-1 of the backside metallization 550 is electrically coupled to the body of the deep trench active device 510 through contact plugs 552 and a backside silicide layer 554. This configuration of the deep trench active device 510 prevents the floating body effect by electrically coupling the backside metallization 550 to the body.

The integrated circuit structure 500 also includes a front-side metallization 570 (e.g., a first BEOL interconnect (M1)) arranged in a front-side dielectric layer 504. The front-side metallization 570 is coupled to a second portion 550-2 of a backside metallization 550 through a via 560. The second portion 550-2 of the backside metallization 550 in the backside dielectric layer 540 is electrically coupled to a body of the second trench-type active device 590 through one of the contact plugs 552 and the backside silicide layer 554. In addition, a handle substrate 502 is coupled to the front-side dielectric layer 504. The backside dielectric layer 540 is adjacent to and possibly supports the isolation layer 530. In this configuration, the post-layer transfer metallization process forms the backside metallization 550. As shown in FIG. 5, the front-side metallization 570 is arranged distal from the backside metallization 550.

According to aspects of the present disclosure, the handle substrate 502 may be composed of a semiconductor material, such as silicon. In this configuration, the handle substrate 502 may include at least one other active device. Alternatively, the handle substrate 502 may be a passive substrate to further improve harmonics by reducing parasitic capacitance. In this configuration, the handle substrate 502 may include at least one other passive device. As described herein, the term "passive substrate" may refer to a substrate of a diced wafer or panel, or may refer to the substrate of a wafer/panel that is not diced. In one configuration, the passive substrate is comprised of glass, air, quartz, sapphire, high-resistivity silicon, or other like passive material. The passive substrate may also be a coreless substrate.

It will be understood that the term "layer" includes film and is not to be construed as indicating a vertical or horizontal thickness unless otherwise stated. As described herein, the term "substrate" may refer to a substrate of a diced wafer or may refer to a substrate of a wafer that is not diced. Similarly, the terms chip and die may be used interchangeably unless such interchanging would tax credulity.

Figure 6:
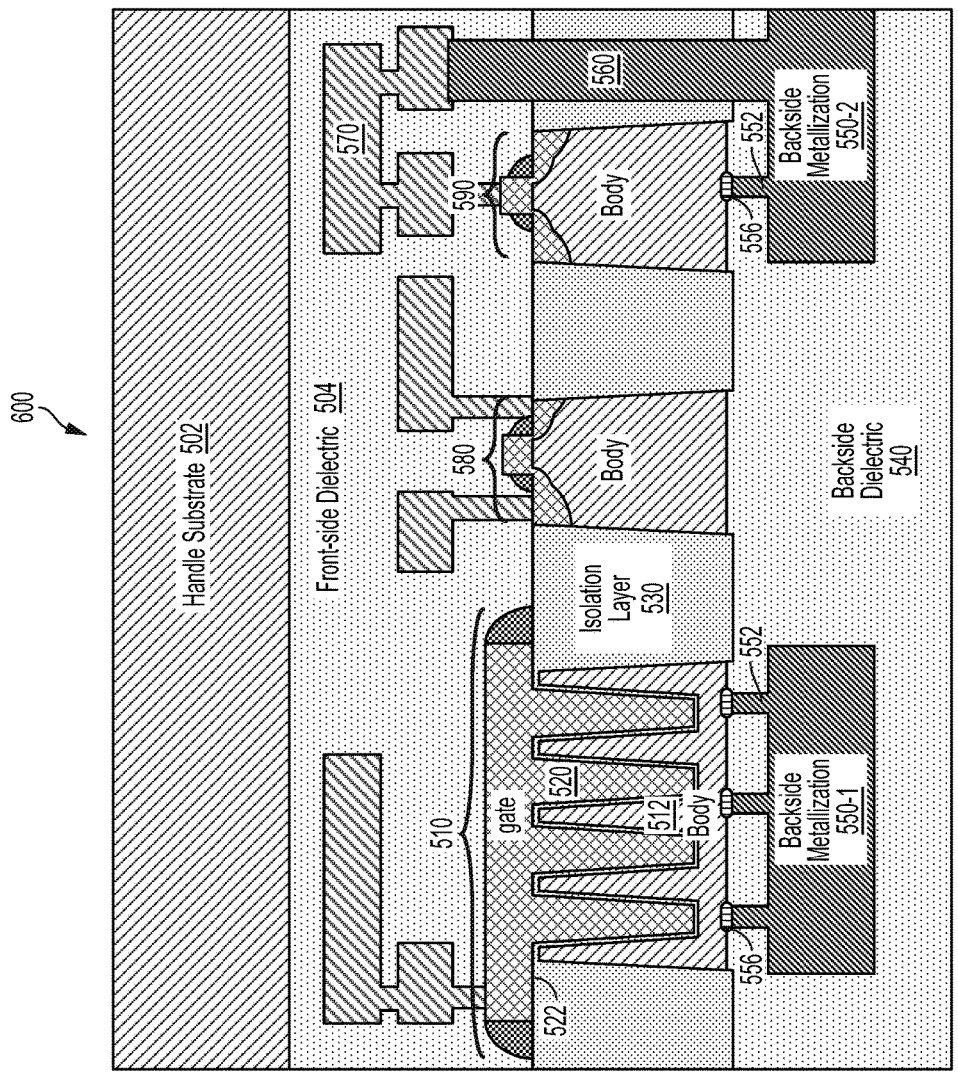
FIG. 6 is a cross-sectional view of an integrated circuit structure, including a deep trench active device having a backside body contact, according to another aspect of the present disclosure.
Figure 7:
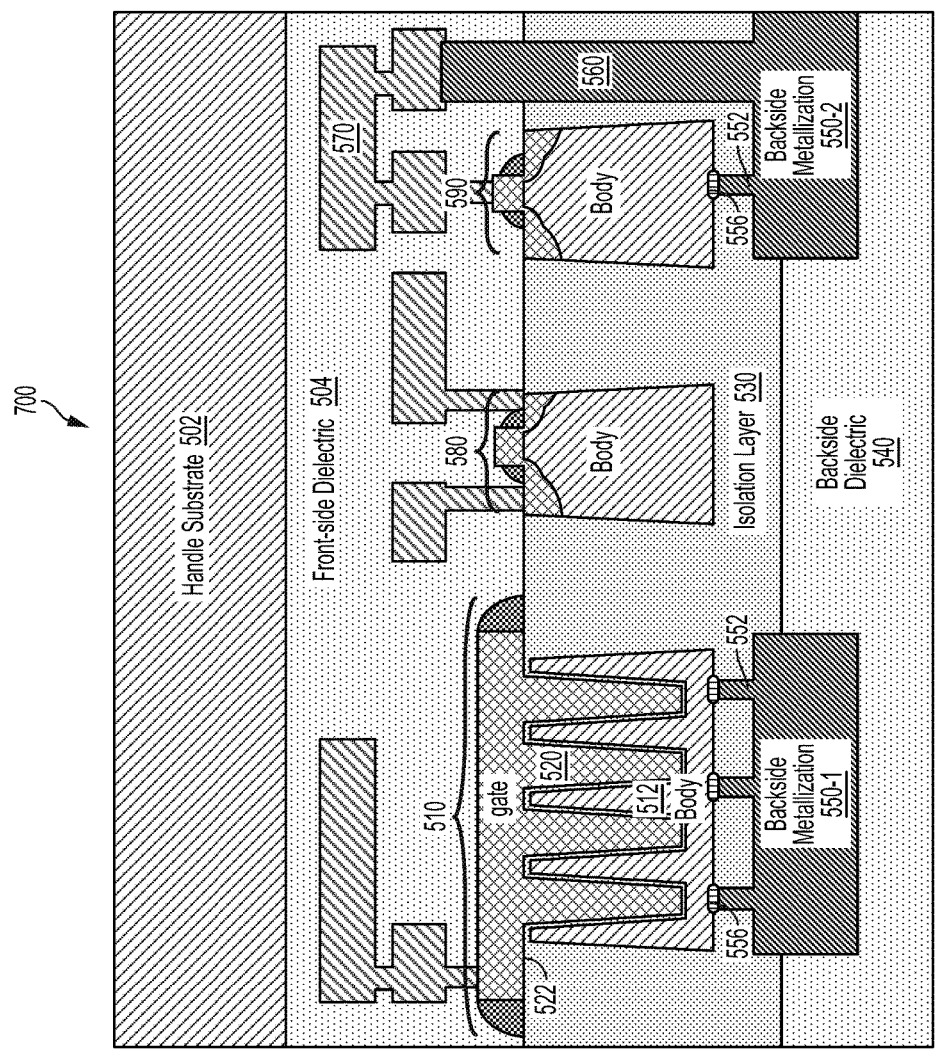
FIG. 7 is a cross-sectional view of an integrated circuit structure, including a deep trench active device having a backside body contact, according to a further aspect of the present disclosure.
Figure 8:
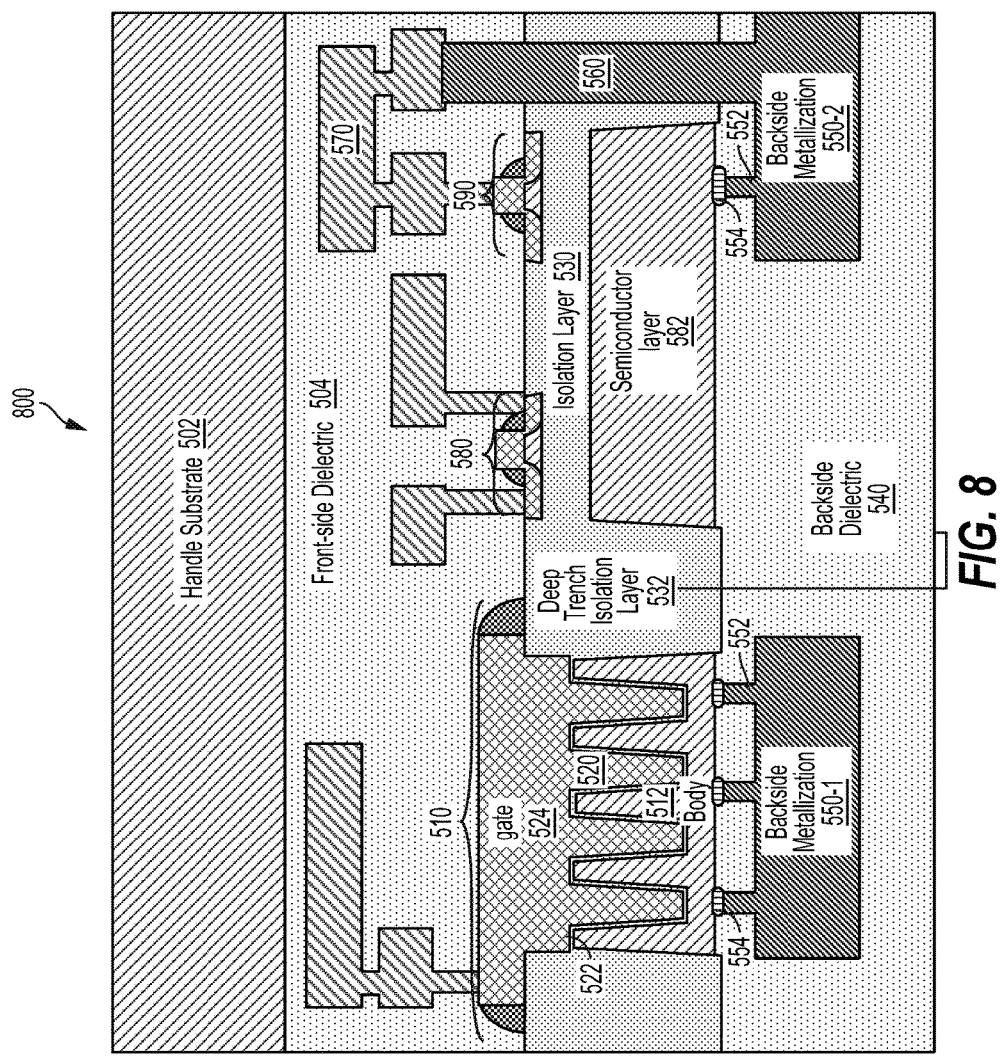
FIG. 8 is a cross-sectional view of an integrated circuit structure, including a deep trench active device having a backside body contact, according to another aspect of the present disclosure.

In aspects of the present disclosure, a post-layer transfer process forms backside metallization for tying a body of the trench-type active devices, as shown in FIGS. 5 to 8. Variations in a backside silicidation process are shown in FIGS. 7 to 8. In addition, variations to the semiconductor layer (e.g., silicon on insulator layer) are shown in FIGS. 7 and 8. According to a further aspect of the present disclosure, the deep trench active device 510 may be configured as a metal oxide semiconductor (MOS) capacitor. In this arrangement, the MOS capacitor including the gate fingers 520 as a first plate, the semiconductor pillars 512 as a second plate, and the dielectric material layer 522 as a capacitor dielectric.

FIG. 6 is a cross-sectional view of an integrated circuit structure 600, including a trench-type active device having a backside body tie according to aspects of the present disclosure. As will be recognized, a configuration of the integrated circuit structure 600 is similar to the configuration of the integrated circuit structure 500 of FIG. 5. In the configuration shown in FIG. 6, however, a back-end-of-line via process (V0) is used to form silicide holes for exposing portions of the body of the deep trench active device 510. That is, in this arrangement, a backside silicide layer 554 (FIG. 5) is deposited as discrete elements on the exposed portions of the body of the deep trench active device 510 rather than the continuous layer of silicide shown in FIG. 5. In addition, the backside silicide layer 554 (FIG. 5) is deposited as a discrete element on an exposed portion of the body of the second trench-type active device 590.

This aspect of the present disclosure, therefore, also solves the floating body effect problem associated with conventional silicon on insulator fabrication processes by providing a simplified post-layer transfer process backside silicidation process for tying the body of the trench type active devices. It should be recognized that the configuration shown in FIG. 6 is fabricated using a bulk wafer rather than an SOI wafer, for example, as shown in FIG. 7.

FIG. 7 is a cross-sectional view of an integrated circuit structure 700, including a trench-type active device having a backside body tie according to aspects of the present disclosure. As will be recognized, a configuration of the integrated circuit structure 700 is similar to the configuration of the integrated circuit structure 600 of FIG. 6. In the configuration shown in FIG. 7, however, an increased thickness semiconductor layer is provided as a silicon on insulator (SOI) layer supported by an SOI wafer. In this arrangement, the isolation layer 530 may be a deep trench isolation layer between the deep trench active device 510 and the first trench-type active device 580 and the second trench-type active device 590.

According to this arrangement, the body of the deep trench active device 510 is also supported by the isolation layer 530. The contact plugs 552 extend through a portion of the isolation layer 530. In addition, the first portion 550-1 and the second portion 550-2 of the backside metallization 550 are formed in a portion of the isolation layer 530 and a portion of the backside dielectric layer 540 to tie the deep trench active device 510 and the second trench-type active device 590. This aspect of the present disclosure, therefore, solves the floating body effect problem associated with conventional silicon on insulator fabrication processes.

FIG. 8 is a cross-sectional view of an integrated circuit structure 800, including a trench-type active device having a backside body tie according to aspects of the present disclosure. As will be recognized, a configuration of the integrated circuit structure 800 is similar to the configuration of the integrated circuit structure 600 of FIG. 6. In the configuration shown in FIG. 8, however, a reduced thickness semiconductor layer is provided as a silicon on insulator (SOI) layer supported by an SOI wafer. In this arrangement, the isolation layer 530 is combined with a deep trench isolation layer 532 between the deep trench active device 510 and the first trench-type active device 580 and the second trench-type active device 590. In one aspect of the present disclosure, a replacement gate process may be performed for fabricating the deep trench active device 510 and/or the first trench-type active device 580 and the second trench-type active device 590 to overcome poly etch limitations (e.g., line/edge roughness) for improved gate formation.

According to this arrangement, the semiconductor pillars 512 of the body of the deep trench active device 510 extend through a portion of the deep trench isolation layer 532. In addition, due to the reduced thickness of the semiconductor layer, the gate includes a first portion 524 (e.g., a trench) coupled to the gate fingers 520 that interlock with the semiconductor pillars 512. In this aspect of the present disclosure, the deep trench active device 510 includes a trench semiconductor layer 582 that is biased by the second portion 550-2 of the backside metallization 550. This aspect of the present disclosure solves the floating body effect problem associated with conventional silicon on insulator fabrication processes by combining a backside biased trench-type active device with an SOI implementation. The deep trench transistors of FIG. 8 are useful when high power or high current transistors are desired.

Figure 9:
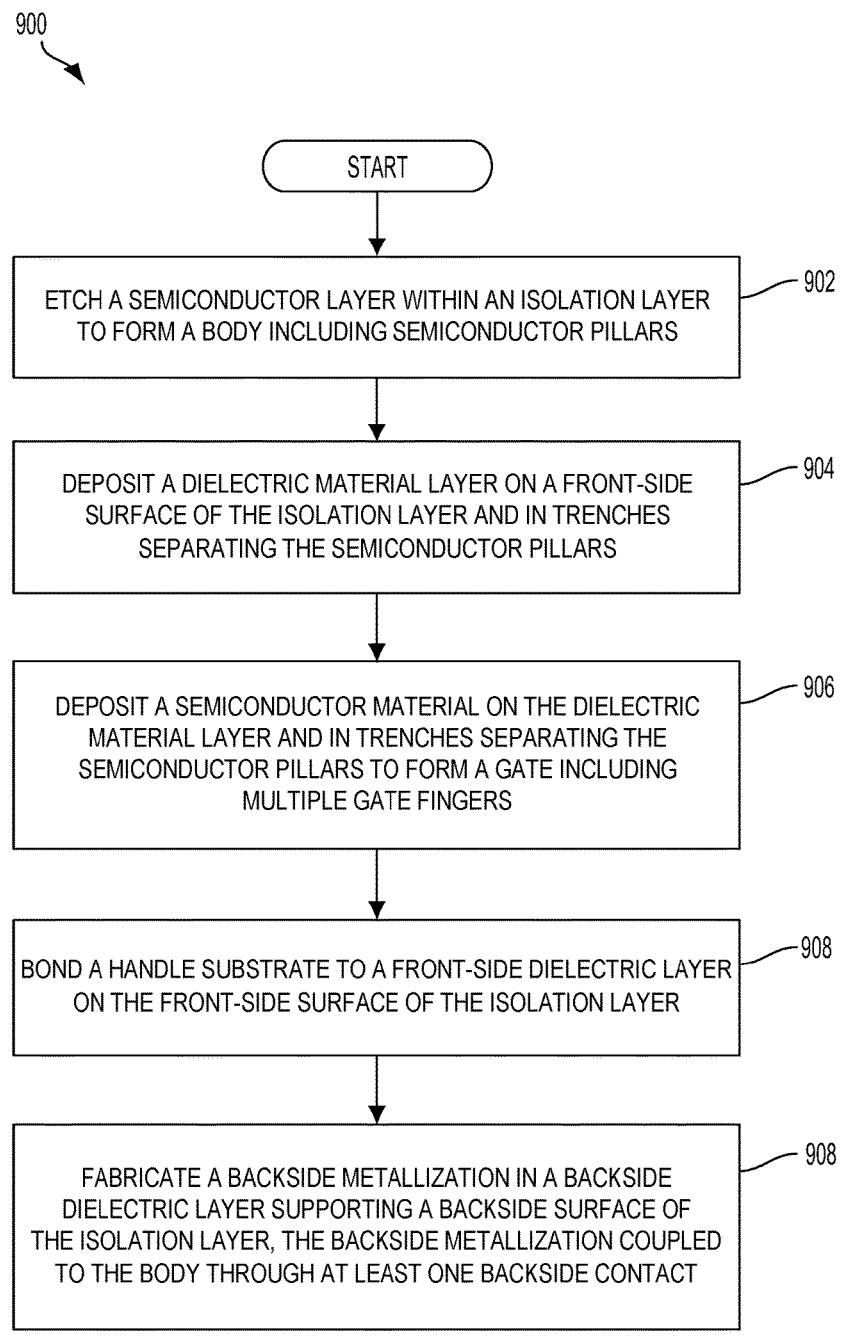
FIG. 9 is a process flow diagram illustrating a method of constructing an integrated circuit structure including a deep trench active device having a backside body contact, according to an aspect of the present disclosure.

FIG. 9 is a process flow diagram illustrating a method 900 of constructing an integrated circuit structure, including a deep trench active device, according to an aspect of the present disclosure. In block 902, a semiconductor layer within an isolation layer is etched to form a body including multiple semiconductor pillars. For example, as shown in FIG. 5, a semiconductor region within the isolation layer 530 is etched to form a body of a deep trench active device 510. The body of the deep trench active device 510 includes semiconductor pillars 512, extending from a backside to a front-side of the isolation layer 530. In a silicon on insulator (SOI) implementation, the isolation layer 530 is a buried oxide (BOX) layer and the semiconductor layer is a silicon on insulator (SOI) layer. The present disclosure, however, is not limited to silicon on insulator implementations.

Referring again to FIG. 9, in block 904, a dielectric material layer is deposited on a front-side surface of the isolation layer and in trenches separating the semiconductor pillars. For example, as shown FIG. 5, a dielectric material layer 522 is deposited on the front-side surface of the isolation layer 530 and on the semiconductor pillars 512 of the body. In block 906, a semiconductor material is deposited on the dielectric material layer and in trenches separating the semiconductor pillars to form a gate including gate fingers. For example, as shown FIG. 5, a semiconductor material (e.g., a polysilicon material) is deposited on the dielectric material layer 522 and the semiconductor pillars 512 of the body to form a gate of the deep trench active device 510. In this arrangement, the gate of the deep trench active device 510 is composed of gate fingers 520 that interlock with the semiconductor pillars 512 of the body. A depth of the deep trenches may be in the range of one (1) to five (5) microns.

In contrast to conventional silicon on insulator implementations, the body of deep trench active device 510 is prevented from floating by tying the body of the deep trench active device 510 as further illustrated in FIG. 9. At block 908, a handle substrate is bonded to a front-side dielectric layer on a front-side surface of the isolation layer. For example, the layer transfer process is performed, in which a handle substrate 502 is bonded to a front-side dielectric layer 504, as shown in FIG. 5. In this aspect of the present disclosure, tying the body of the deep trench active device 510 is performed as part of a post-layer transfer process.

Referring again to FIG. 9, in block 910, a backside metallization is fabricated in a backside dielectric layer supporting a backside surface of the isolation layer. The backside metallization is coupled to the body of the deep trench active device through at least one backside contact. For example, as shown in FIG. 5, the backside metallization 550 is coupled to the body of the deep trench active device 510. In this arrangement, the backside metallization 550 is directly coupled to contact plugs 552 that are coupled to the body of the deep trench active device 510 though a backside silicide layer 554. In this arrangement, the body of the deep trench active device 510 is prevented from floating by the backside metallization 550 that is fabricated as part of the post-layer transfer process.

According to a further aspect of the present disclosure, integrated circuits, including trench-type active devices are described. An integrated RF circuit structure includes a gate, having gate fingers and a body, having semiconductor pillars interlocking with the gate fingers of the gate. The integrated RF circuit may also include a backside contact(s) coupled to the body. The integrated circuit may further include a means for tying the body through the backside contact(s). The tying means may be the backside metallization 550, shown in FIGS. 5-8. In another aspect, the aforementioned means may be any module or any apparatus configured to perform the functions recited by the aforementioned means.

Conventional silicon on insulator fabrication processes suffer from the floating body effect. Aspects of the present disclosure describe a deep trench switch transistor with a backside body contact that may be used as antenna switch transistor in integrated radio frequency (RF) circuit structures for high quality (Q)-factor RF applications. In one configuration, a pre-layer transfer process forms the deep trench switch transistor. In addition, a post-layer transfer process forms a backside body contact to tie the body of the deep trench switch transistor. The post-layer transfer process of forming the backside body tie solves the floating body effect problem by preventing the body of the deep switch transistor from floating. A backside body contact avoids an area penalty or unwanted resistance paths associated with conventional body contacts. In addition, arrangement of the deep trench switch transistor using gate fingers reduces a surface area occupied by the gate of the deep trench switch transistor.

Figure 10:
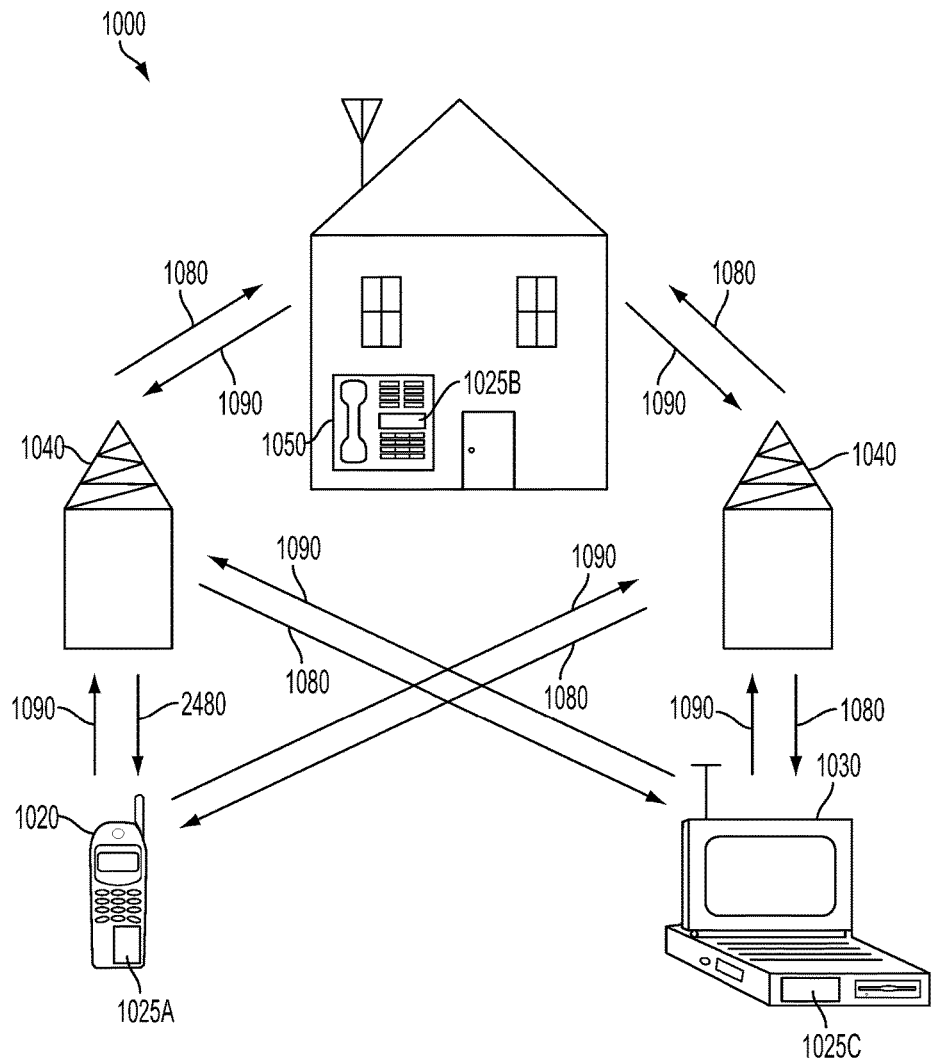
FIG. 10 is a block diagram showing an exemplary wireless communication system in which a configuration of the disclosure may be advantageously employed.

FIG. 10 is a block diagram showing an exemplary wireless communication system 1000 in which an aspect of the disclosure may be advantageously employed. For purposes of illustration, FIG. 10 shows three remote units 1020, 1030, and 1050 and two base stations 1040. It will be recognized that wireless communication systems may have many more remote units and base stations. Remote units 1020, 1030, and 1050 include IC devices 1025A, 1025C, and 1025B that include the disclosed deep trench active device. It will be recognized that other devices may also include the disclosed deep trench active device, such as the base stations, switching devices, and network equipment. FIG. 10 shows forward link signals 1080 from the base station 1040 to the remote units 1020, 1030, and 1050 and reverse link signals 1090 from the remote units 1020, 1030, and 1050 to base stations 1040.

In FIG. 10, remote unit 1020 is shown as a mobile telephone, remote unit 1030 is shown as a portable computer, and remote unit 1050 is shown as a fixed location remote unit in a wireless local loop system. For example, a remote units may be a mobile phone, a hand-held personal communication systems (PCS) unit, a portable data unit such as a personal digital assistant (PDA), a GPS enabled device, a navigation device, a set top box, a music player, a video player, an entertainment unit, a fixed location data unit such as a meter reading equipment, or other communications device that stores or retrieve data or computer instructions, or combinations thereof. Although FIG. 10 illustrates remote units according to the aspects of the disclosure, the disclosure is not limited to these exemplary illustrated units. Aspects of the disclosure may be suitably employed in many devices, which include the disclosed deep trench active device.

Figure 11:
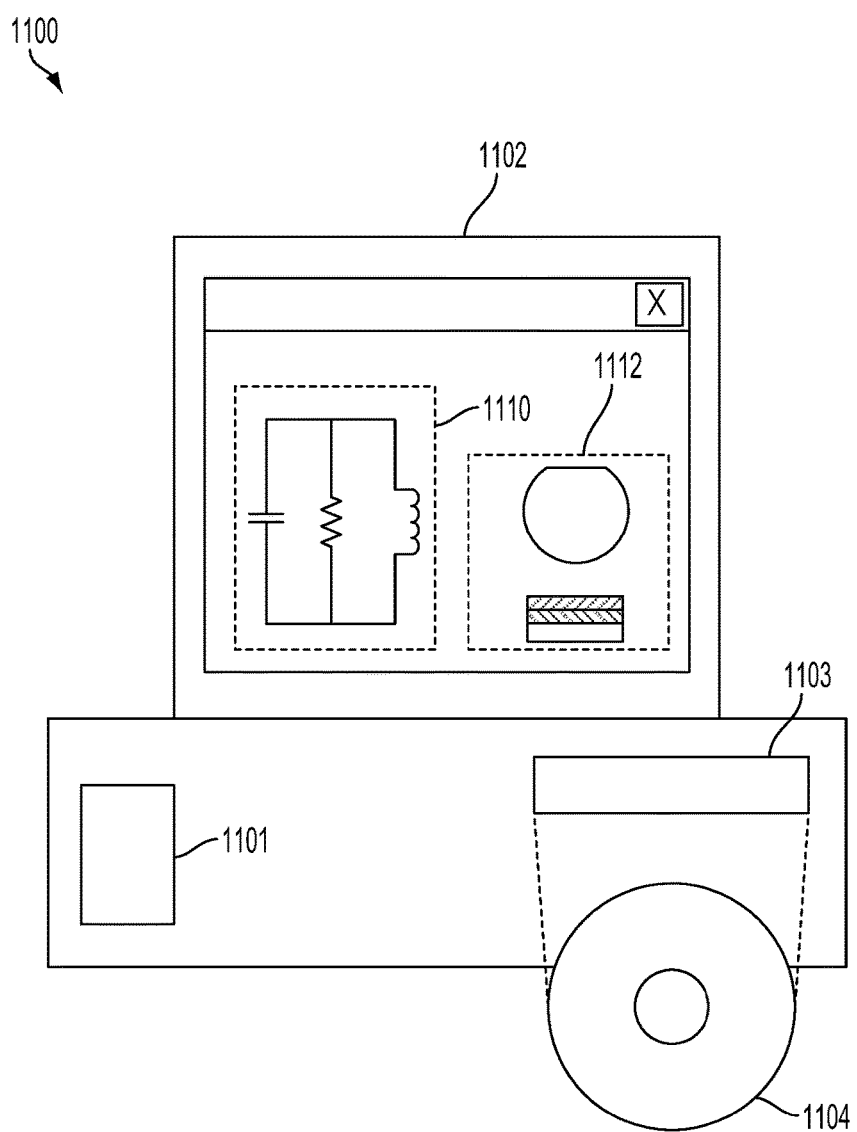
FIG. 11 is a block diagram illustrating a design workstation used for circuit, layout, and logic design of a semiconductor component according to one configuration.

FIG. 11 is a block diagram illustrating a design workstation used for circuit, layout, and logic design of a semiconductor component, such as the deep trench active device disclosed above. A design workstation 1100 includes a hard disk 1101 containing operating system software, support files, and design software such as Cadence or OrCAD. The design workstation 1100 also includes a display 1102 to facilitate design of a circuit 1110 or a semiconductor component 1112 such as a deep trench active device. A storage medium 1104 is provided for tangibly storing the circuit design 1110 or the semiconductor component 1112. The circuit design 1110 or the semiconductor component 1112 may be stored on the storage medium 1104 in a file format such as GDSII or GERBER. The storage medium 1104 may be a CD-ROM, DVD, hard disk, flash memory, or other appropriate device. Furthermore, the design workstation 1100 includes a drive apparatus 1103 for accepting input from or writing output to the storage medium 1104.

Data recorded on the storage medium 1104 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 1104 facilitates the design of the circuit design 1110 or the semiconductor component 1112 by decreasing the number of processes for designing semiconductor wafers.

For a firmware and/or software implementation, the methodologies may be implemented with modules (e.g., procedures, functions, and so on) that perform the functions described herein. A machine-readable medium tangibly embodying instructions may be used in implementing the methodologies described herein. For example, software codes may be stored in a memory and executed by a processor unit. Memory may be implemented within the processor unit or external to the processor unit. As used herein, the term "memory" refers to types of long term, short term, volatile, nonvolatile, or other memory and is not to be limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer; disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions and alterations can be made herein without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular configurations of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding configurations described herein may be utilized according to the present disclosure. Accordingly, the appended claims are intended to include within their scope such processes, machines, manufacture, compositions of matter, means, methods, or steps.

What is claimed is:

1. An integrated circuit, comprising:
   a gate including a plurality of gate fingers;
   a body including a plurality of semiconductor pillars interlocking with the plurality of gate fingers;
   at least one backside contact coupled to the body; and
   a backside metallization coupled to the body through the at least one backside contact.

2. The integrated circuit of claim 1, in which the plurality of gate fingers comprise a polysilicon material.

3. The integrated circuit of claim 1, further comprising a gate dielectric between the plurality of gate fingers and the plurality of semiconductor pillars.

4. The integrated circuit of claim 3, further comprising a capacitor including the plurality of gate fingers as a first plate, the plurality of semiconductor pillars as a second plate, and the gate dielectric as a capacitor dielectric.

5. The integrated circuit of claim 1, in which the backside contact comprises a plurality of contact plugs, each coupled between the body and the backside metallization, the backside metallization directly coupled to the plurality of contact plugs.

6. The integrated circuit of claim 1, further comprising a backside silicide directly between the backside contact and the body.

7. The integrated circuit of claim 6, in which the backside silicide comprises a plurality of discrete elements, directly on the body, or the backside silicide comprises a continuous layer on the body.

8. The integrated circuit of claim 1, further comprising:
   a first doped region of the body proximate a first side of the gate; and
   a second doped region of the body proximate a second side opposite the first side of the gate.

9. The integrated circuit of claim 8, in which the first doped region is a source region and the second doped region is a drain region.

10. The integrated circuit of claim 1, further comprising:
    a buried oxide (BOX) layer; and
    a backside dielectric layer supporting the buried oxide layer, in which the body extends through the buried oxide layer and is supported by the backside dielectric layer, and the backside contact and the backside metallization are in the backside dielectric layer.

11. The integrated circuit of claim 1, further comprising:
    a buried oxide (BOX) layer; and
    a backside dielectric layer supporting the buried oxide layer, in which the body extends into the buried oxide layer, and the backside contact extends into the buried oxide layer to couple to the body and the backside metallization.

12. The integrated circuit of claim 1, further comprising:
    a buried oxide layer through which a first portion of the gate extends, the first portion coupling to the plurality of gate fingers; and
    a backside dielectric layer supporting the buried oxide layer.

13. The integrated circuit of claim 1, integrated into a radio frequency (RF) front end module, the RF front end module incorporated into at least one of a music player, a video player, an entertainment unit, a navigation device, a communications device, a personal digital assistant (PDA), a fixed location data unit, a mobile phone, and a portable computer.

14. A method of constructing an integrated circuit, comprising:
- etching a semiconductor layer within an isolation layer to form a body including a plurality of semiconductor pillars;
- depositing a dielectric material layer on a front-side surface of the isolation layer and on a surface of the plurality of semiconductor pillars;
- depositing a semiconductor material on the dielectric material layer and in a plurality of trenches separating the plurality of semiconductor pillars to form a gate including a plurality of gate fingers, the plurality of gate fingers interlocking with the plurality of semiconductor pillars;
- bonding a handle substrate to a front-side dielectric layer on the front-side surface of the isolation layer; and
- fabricating a backside metallization in a backside dielectric layer supporting a backside surface of the isolation layer, the backside metallization coupled to the body through at least one backside contact.

15. The method of claim 14, in which depositing the semiconductor material comprises depositing a polysilicon material on the dielectric material layer and in the plurality of trenches separating the plurality of semiconductor pillars to form the gate including the plurality of gate fingers.

16. The method of claim 14, further comprising depositing a backside silicide directly between the backside contact and the body.

17. The method of claim 16, further comprising depositing the backside silicide as a plurality of discrete elements, directly on the body, or as a continuous layer on the body.

18. The method of claim 14, further comprising:
- doping a first doped region of the body proximate a first side of the gate; and
- doping a second doped region of the body proximate a second side opposite the first side of the gate.

19. The method of claim 14, in which depositing the semiconductor material further comprises depositing a first portion of the gate that extends through a buried oxide layer, the first portion of the gate coupling to the plurality of gate fingers.

20. The method of claim 14, further comprising integrating the integrated circuit into a radio frequency (RF) front end module, the RF front end module incorporated into at least one of a music player, a video player, an entertainment unit, a navigation device, a communications device, a personal digital assistant (PDA), a fixed location data unit, a mobile phone, and a portable computer.

21. An integrated circuit, comprising:
- a gate including a plurality of gate fingers;
- a body including a plurality of semiconductor pillars interlocking with the plurality of gate fingers;
- at least one backside contact coupled to the body; and
- means for tying the body through the at least one backside contact.

22. The integrated circuit of claim 21, further comprising:
- a first doped region of the body proximate a first side of the gate; and
- a second doped region of the body proximate a second side opposite the first side of the gate.

23. The integrated circuit of claim 21, integrated into a radio frequency (RF) front end module, the RF front end module incorporated into at least one of a music player, a video player, an entertainment unit, a navigation device, a communications device, a personal digital assistant (PDA), a fixed location data unit, a mobile phone, and a portable computer.

24. A radio frequency (RF) front end module, comprising:
- an integrated RF circuit, comprising a deep trench switch transistor including a gate including a plurality of gate fingers and a body including a plurality of semiconductor pillars interlocking with the plurality of gate fingers, at least one backside contact coupled to the body, and a backside metallization coupled to the body through the at least one backside contact; and
- an antenna coupled to an output of the switch transistor.

25. The RF front end module of claim 24, incorporated into at least one of a music player, a video player, an entertainment unit, a navigation device, a communications device, a personal digital assistant (PDA), a fixed location data unit, a mobile phone, and a portable computer.

* * * * *